(12) United States Patent
Lee et al.

(10) Patent No.: US 10,446,779 B2
(45) Date of Patent: Oct. 15, 2019

(54) DISPLAY DEVICE AND MANUFACTURING METHOD THEREOF

(71) Applicant: Samsung Display Co., Ltd., Yongin-si, Gyeonggi-do (KR)

(72) Inventors: Jun Hee Lee, Hwaseong-si (KR); In Jun Bae, Seoul (KR); Seong Baik Chu, Busan (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/974,814

(22) Filed: May 9, 2018

(65) Prior Publication Data

US 2019/0081267 A1    Mar. 14, 2019

(30) Foreign Application Priority Data

Sep. 8, 2017  (KR) .................. 10-2017-0115393

(51) Int. Cl.
*H01L 51/50* (2006.01)
*H01L 51/52* (2006.01)
(Continued)

(52) U.S. Cl.
CPC .......... *H01L 51/5012* (2013.01); *H01L 24/09* (2013.01); *H01L 27/3262* (2013.01);
(Continued)

(58) Field of Classification Search
CPC . H01L 51/5203; H01L 51/56; H01L 51/5012; H01L 51/5218; H01L 51/5221; H01L 24/09; H01L 27/3262; H01L 27/3276; H01L 2224/05166; H01L 2224/05124; H01L 2251/5315; G02F 2201/123
See application file for complete search history.

(56) References Cited

U.S. PATENT DOCUMENTS

| 8,796,768 B2 * | 8/2014 | You | H01L 29/4908 257/347 |
| 2011/0121302 A1 * | 5/2011 | Lee | H01L 27/3262 257/59 |

(Continued)

FOREIGN PATENT DOCUMENTS

| EP | 0513894 A2 | 11/1992 |
| JP | 4640565 B2 | 12/2010 |

(Continued)

*Primary Examiner* — Jasmine J Clark
(74) *Attorney, Agent, or Firm* — Cantor Colburn LLP

(57) ABSTRACT

A display device includes: a substrate including a display area at which an image is displayed with light and a pad region at which the image is not displayed; a plurality of pads through which a signal is applied to the display area, the pads disposed in the pad region; a first insulating layer disposed between adjacent pads among the plurality of pads, in which a first opening is defined which exposes a respective pad among the adjacent pads; a second insulating layer disposed in the first opening of the first insulating layer, in which a second opening is defined which exposes the respective pad exposed by the first opening of the first insulating layer; and silver particles disposed in the first opening, between the first insulating layer and the second insulating layer.

16 Claims, 5 Drawing Sheets

(51) Int. Cl.
*H01L 51/56* (2006.01)
*H01L 27/32* (2006.01)
*H01L 23/00* (2006.01)

(52) U.S. Cl.
CPC ...... *H01L 27/3276* (2013.01); *H01L 51/5221* (2013.01); *H01L 51/56* (2013.01); *G02F 2201/123* (2013.01); *H01L 51/5218* (2013.01); *H01L 2224/05124* (2013.01); *H01L 2224/05166* (2013.01); *H01L 2251/5315* (2013.01)

(56) References Cited

U.S. PATENT DOCUMENTS

| | | | |
|---|---|---|---|
| 2012/0146060 A1* | 6/2012 | Moon et al. | H01L 27/3276 257/88 |
| 2012/0193656 A1* | 8/2012 | Tseng | H01L 27/3276 257/88 |
| 2015/0084008 A1* | 3/2015 | Park | H01L 27/3265 257/40 |
| 2017/0172018 A1 | 6/2017 | Dilmaghanian et al. | |

FOREIGN PATENT DOCUMENTS

| | | |
|---|---|---|
| KR | 100285871 B1 | 4/2001 |
| KR | 100543495 B1 | 1/2006 |
| KR | 101699175 B1 | 1/2017 |
| KR | 101750005 B1 | 6/2017 |

\* cited by examiner

DISPLAY DEVICE AND MANUFACTURING METHOD THEREOF

This application claims priority to Korean Patent Application No. 10-2017-0115393 filed on Sep. 8, 2017, and all the benefits accruing therefrom under 35 U.S.C. § 119, the entire contents of which are incorporated herein by reference.

BACKGROUND

(a) Field

The present disclosure relates to a display device.

(b) Description of the Related Art

An active matrix emissive display device includes a light emitting diode including an anode (hole injection electrode), an emission layer and a cathode (electron injection electrode), and a thin film transistor for driving the light emitting diode. Holes injected from the anode and electrons injected from the cathode are combined in an organic emission layer to generate excitons. Light is emitted by energy generated when the excitons fall from an excited state to a ground state. Such a display device may display an image by using this emission.

In an organic light emitting diode display, a display area and a non-display area each positioned in the display area are defined. The non-display area includes a pad region in which pads are formed. The pads are exposed to the outside the display in order to accomplish connection thereof with an external circuit.

SUMMARY

Exemplary embodiments have been made in an effort to provide a display device capable of reducing or effectively preventing movement of silver particles precipitated to the pad region and pixel defects caused thereby, by adding an insulating layer into the pad region.

An exemplary embodiment of the invention provides a display device including: a substrate including a display area at which an image is displayed with light and a pad region at which the image is not displayed; a plurality of pads through which a signal is applied to the display area, the pads disposed in the pad region; a first insulating layer disposed between adjacent pads among the plurality of pads, in which a first opening is defined which exposes a respective pad among the adjacent pads; a second insulating layer disposed in the first opening of the first insulating layer, in which a second opening is defined which exposes the respective pad exposed by the first opening of the first insulating layer; and silver particles disposed in the first opening, between the first insulating layer and the second insulating layer.

The silver particles disposed in the first opening may be positioned at an interface between the respective pad and the first insulating layer, and are covered with the second insulating layer.

The pads may include a material having a degree of ionization lower than that of silver.

The second insulating layer may be an organic layer or an inorganic layer.

The second insulating layer may include a polyimide.

The display area may include: a thin film transistor including a gate line, a data line and a semiconductor; and a first electrode connected with the thin film transistor. The pads may include a same material as that of the data line.

The pads may include aluminum.

The pads may have a triple-layer structure of titanium/aluminum/titanium.

The first electrode may include silver.

The first electrode may have a triple-layer structure of indium tin oxide/silver/indium tin oxide ("ITO/Ag/ITO").

The display area may further include an interlayer insulating layer disposed between the thin film transistor and the first electrode, and the interlayer insulating layer in the display area may include a same material as that of the first insulating layer between the adjacent pads in the pad region.

A diameter of the silver particles in the first opening of the first insulating layer may be in a range of about 0.1 micrometer (µm) to about 1 µm.

A thickness of the second insulating layer in the first opening of the first insulating layer may be in a range of about 1 µm to about 3 µm.

The second insulating layer in the first opening of the first insulating layer may contact the side surface and a top surface of the first insulating layer at the first opening thereof.

A width of the second opening of the second insulating layer is in a range of about 5 µm to about 15 µm.

According to one or more exemplary embodiment, fixing of silver particles precipitated to the pads in the pad region as a result of processing a display area element, is possible by adding the insulating layer into the pad region to cover the silver particles, thereby reducing or effectively preventing movement of the silver particles from the pad region to the display area and pixel defects caused thereby.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
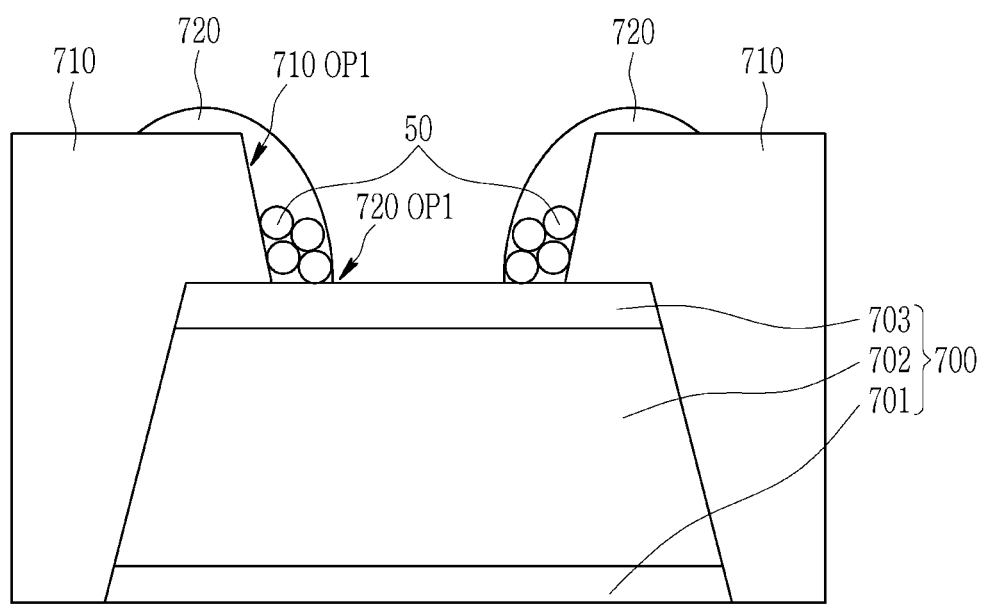
FIG. 1 illustrates a cross-section of an exemplary embodiment of a pad within a pad region of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

To clearly describe the invention, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the invention is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Further, the word "over" or "on" means positioning on or below the object portion, and does not essentially mean positioning on the upper side of the object portion based on a gravity direction.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, an exemplary embodiment of a display device according to the invention will be described with reference to the accompanying drawings. The display device according to the exemplary embodiment of the invention includes a substrate including a display area at which an image is displayed, a non-display area at which the image is not displayed and a pad region within the non-display area, a plurality of pads disposed in the pad region, a first insulating layer disposed between adjacent pads to have a first opening that overlaps the respective pads, and a second insulating layer disposed in the first opening of the first insulating layer to have a second opening that overlaps the respective pads. In this case, at least one silver particle is fixed between the first insulating layer and the second insulating layer.

Specifically, the invention reduces or effectively prevents defects in the display area caused by movement of a plurality of silver particles generated in a manufacturing process of a display area element, by covering the silver particles disposed at the pad region with the second insulating layer to fix positions thereof at the pad region. Now, the invention will be briefly described through a cross-section of the pad region.

FIG. 1 illustrates a cross-section of an exemplary embodiment of a pad within a pad region of a display device according to the invention.

Referring to FIG. 1, the pad region of the display device according to the exemplary embodiment of the invention includes a pad 700 provided in plurality, a first insulating layer 710 disposed between adjacent pads 700, a second insulating layer 720 disposed to contact at least a side surface of the first insulating layer 710 and a top surface of the pads 700, and a silver particle 50 disposed between the first insulating layer 710 and the second insulating layer 720. The silver particle 50 may be provided in plurality between the first insulating layer 710 and the second insulating layer 720. The silver particles 50 are surrounded and a position thereof is fixed by the second insulating layer 720.

Each of the pads 700 may be formed as a single layer or multiple layers. In an exemplary embodiment, for example, FIG. 1 illustrates the pad 700 has a structure of multiple layers, but the pad 700 may have a single layer structure. When the pad 700 has the structure of multiple layers, the pad 700 may include a first layer 701 including titanium, a second layer 702 including aluminum and a third layer 703 including titanium. In other words, the pad 700 may have a triple-layer structure of titanium/aluminum/titanium.

The pads 700 will be described later, but in a method of manufacturing a display device, the pads 700 are formed in a same process and/or from a same material layer as that of a conductive signal line in the display area, through which a control or driving signal is transmitted from outside the display area to the display area for generating and displaying an image with light. The signal transmitted through the conductive signal line may be provided to a display unit of the display area by which the image is generated and/or displayed with light. In an exemplary embodiment the pads 700 are formed in a same process and/or from a same material layer as that of a data (signal) line of the display area, and thus the pads 700 may include a same material as that of the data line of the display area.

The display device may include the display area and the pad region. A pixel electrode may be disposed in the display area, with which the image is generated and/or displayed with light by a control or driving signal applied thereto. A transparent conductive oxide may be used as a material for forming the pixel electrode of the display device. An example of the transparent conductive oxide may include indium tin oxide, indium zinc oxide, gallium indium tin oxide and gallium indium zinc oxide. The pixel electrode may be formed of a single layer including a transparent conductive oxide, but may be formed of multiple layers of a transparent conductive oxide/a metal/a transparent conductive oxide. In this case, silver may be used as the metal. In an exemplary embodiment, for example, the pixel electrode may have a triple-layer structure of indium tin oxide ("ITO")/silver ("Ag)/indium tin oxide ("ITO").

In an exemplary embodiment of manufacturing a display device, an etchant is used in an etching process for forming the pixel electrode. The etchant etches a plate shape pixel electrode material layer to form the pixel electrode having a certain shape. Silver (Ag) included in the pixel electrode melts such as during the etching process to generate a form of silver ions ($Ag^+$).

The generated ions ($Ag^+$) may be positioned at an upper portion of the pad region in the process in which the silver material forming the pixel electrode melts. Each pad 700 of the pad region has an upper portion exposed to outside thereof for connection with a driver and the like. Specifically, the first insulating layer 710 for insulating adjacent pads 700 from each other includes a first opening 710 OP1 for exposing upper portions of the respective pads 700. Top surfaces of the pads 700 include regions that are not covered by the first insulating layer 710 due to the first opening 710 OP1.

Since the pad 700 is partially exposed, the pad 700 is partially oxidized in the process of etching for forming the pixel electrode. In an exemplary embodiment, for example, when the pad 700 includes aluminum, the aluminum is oxidized and melted to supply electrons. Since an ionization degree of the aluminum is higher than that of silver, silver ions ($Ag^+$) generated in the etching process of the pixel electrode receive the electrons supplied while the aluminum is oxidized to precipitate to an edge of the pad 700 in a form of the silver (Ag) particles 50.

Figure 2:
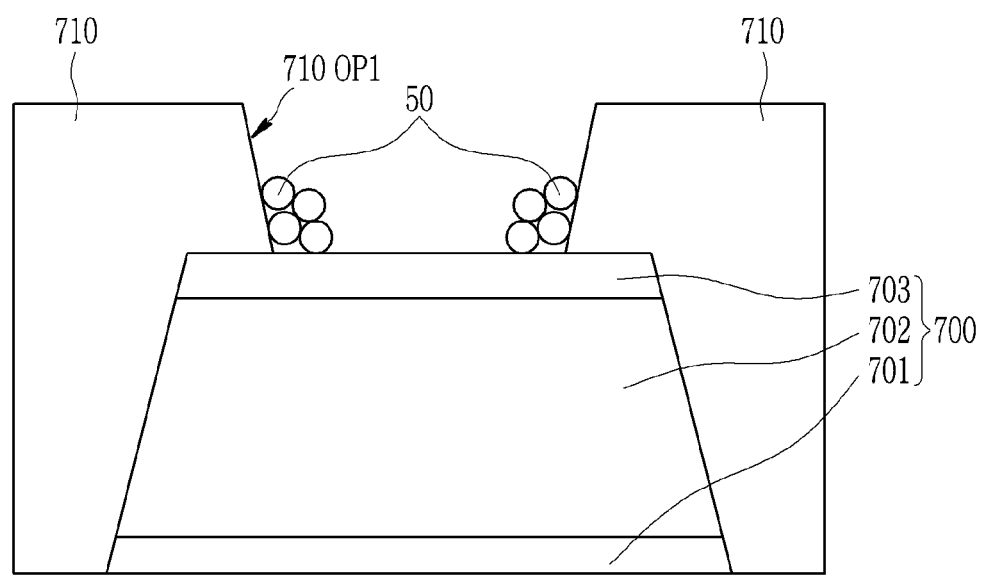
FIG. 2 illustrates a pad of a pad region to which silver particles are precipitated.

FIG. 2 illustrates a pad of a pad region to which silver particles are precipitated and which excludes the second insulating layer 720. Referring to FIG. 2, the silver particles 50 precipitate at the edges of the exposed top surface of the pad 700. When the pad 700 has the multilayer structure, the aluminum is positioned in the second layer 702 of the pads 700, the oxidation is performed at a fine gap occurring at an interface between the first insulating layer 710 and the pad 700, and electrons are supplied from the edge where the first insulating layer 710 and the pad 700 meet. The silver particles 50 are exposed to outside the pad 700.

Referring to FIG. 2, when the silver particles 50 precipitate and are exposed to outside the pad 700, these silver particles 50 undesirably move to the display area in a manufacturing process of the display device, and are positioned in the pixel electrode of the display area or an electrode bonding portion, thereby causing pixel defects.

However, one or more embodiment of the pad region of the display device according to the invention may further include the second insulating layer 720 disposed on the pad 700. The second insulating layer 720 may include a second opening 720 OP1 to connect the pad 700 with a driver and the like. The second insulating layer 720 is positioned in the first opening 710 OP1 of the first insulating layer 710, along an edge of the first opening 710 OP1. The second opening 720 OP1 cooperates with the first opening 710 OP to form a continuous opening which exposes the upper portion (e.g., third layer 703) of the pad 700. Accordingly, the silver particles 50 that precipitate in the edge of the first opening 710 OP1 are collected to be fixed at a position within the pad 700 and not exposed to outside thereof, to reduce or effectively prevent the silver particles 50 from moving away from the pad and to the display area and the like and causing defects.

In this case, the second insulating layer 720 may be an organic layer or an inorganic layer. In other words, when the silver particles 50 are physically fixed at a position within the pad 700, the second insulating layer 720 may include or be formed of any of a number of materials without limitation. In an exemplary embodiment, for example, the second insulating layer 720 may include a polyimide.

In the exemplary embodiment, a thickness of the second insulating layer 720 may be in a range of about 1 micrometer ($\mu$m) to about 3 $\mu$m. The thickness may be taken in a direction normal to an underlying surface of the first insulating layer 710 and/or a layer of the pad 700. In the manufacturing process, a diameter of the precipitating silver particles may be in a range of about 0.1 $\mu$m to about 1 $\mu$m. Accordingly, the silver particles 50 within such a range may be covered by the second insulating layer 720 having the thickness of about 1 $\mu$m to about 3 $\mu$m such that the silver particles 50 are not exposed to outside the pad 700. When the thickness of the second insulating layer 720 is smaller than 1 $\mu$m, fixing of the silver particles 50 is not sufficient. When the thickness of the second insulating layer 720 is greater than 3 $\mu$m, an overall dimension (e.g., width in a direction parallel to the upper surface of the pad 700) of the second opening 720 OP1 is reduced so that connection between the pad 700 and an external component such as the driver may not be easily made. In an exemplary embodiment, for example, a total or maximum width of the second opening 720 OP1 taken in a direction parallel to the upper surface of the pad 700 (e.g., defined by the third layer 703) may be in a range of about 5 $\mu$m to about 15 $\mu$m.

Although it is illustrated in FIG. 1 that the second insulating layer 720 contacts both a side surface and a top surface of the first insulating layer 710, the second insulating layer 720 may only contact the side surface of the first insulating layer 710.

In an exemplary embodiment of manufacturing a display device, the second insulating layer 720 may be formed in an inkjet method. However, the method is not limited thereto. In an alternative exemplary embodiment, for example, the second insulating layer 720 may be formed by using an etching method using a mask instead an inkjet method. In addition, a material for forming the second insulating layer 720 is not limited, and the second insulating layer 720 may be formed by using a same process and/or a same material layer as that of an insulating layer within the display area, and the like. However, since the second insulating layer 720 is disposed to cover the silver particles which are precipitated in forming the pixel electrode of the display area as described about, the second insulating layer 720 is formed after the etching process of the pixel electrode of the display area.

Hereinafter, a display device including a pad region according to an exemplary embodiment of the invention will be described in detail with reference to drawings.

Figure 3:
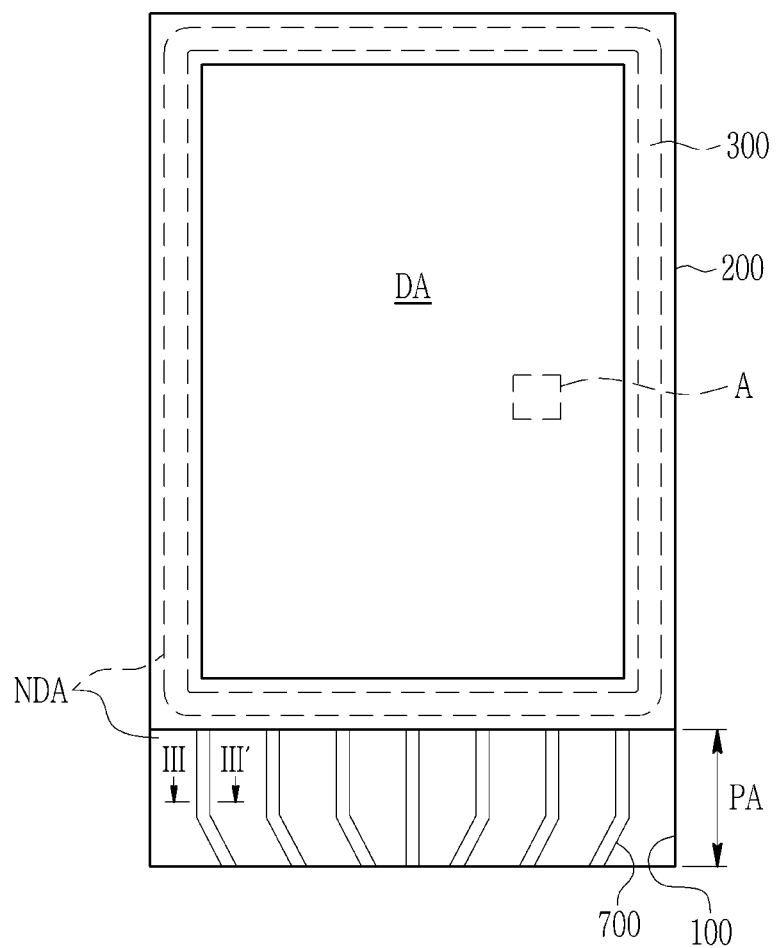
FIG. 3 is a top plan view schematically illustrating an exemplary embodiment of a display device according to the invention.

FIG. 3 is a top plan view schematically illustrating an exemplary embodiment of a display device according to the invention.

Referring to FIG. 3, an organic light emitting diode display according to the exemplary embodiment includes a first (display) substrate 100, a second (display) substrate 200 and a sealing member 300. However, the invention is not limited thereto. Accordingly, the first substrate 100 may be encapsulated by an encapsulation film and the like instead of the second substrate 200.

The first substrate 100 includes a display area DA and a non-display area NDA which is positioned at an outer circumference of the display area DA. In the display area DA, a light emitting element such as an organic light emitting element, a switching element such as thin film transistor for driving the light emitting element, conductive wires for connecting elements to each other or for transmitting control/driving signals, and the like are positioned. The non-display area NDA includes a pad region PA in which a pad 700 is provided in plurality for receiving an external (control or driving) signal for operating the light-emitting element to emit light and for transferring the external signal to the organic light emitting element are formed.

Figure 4:
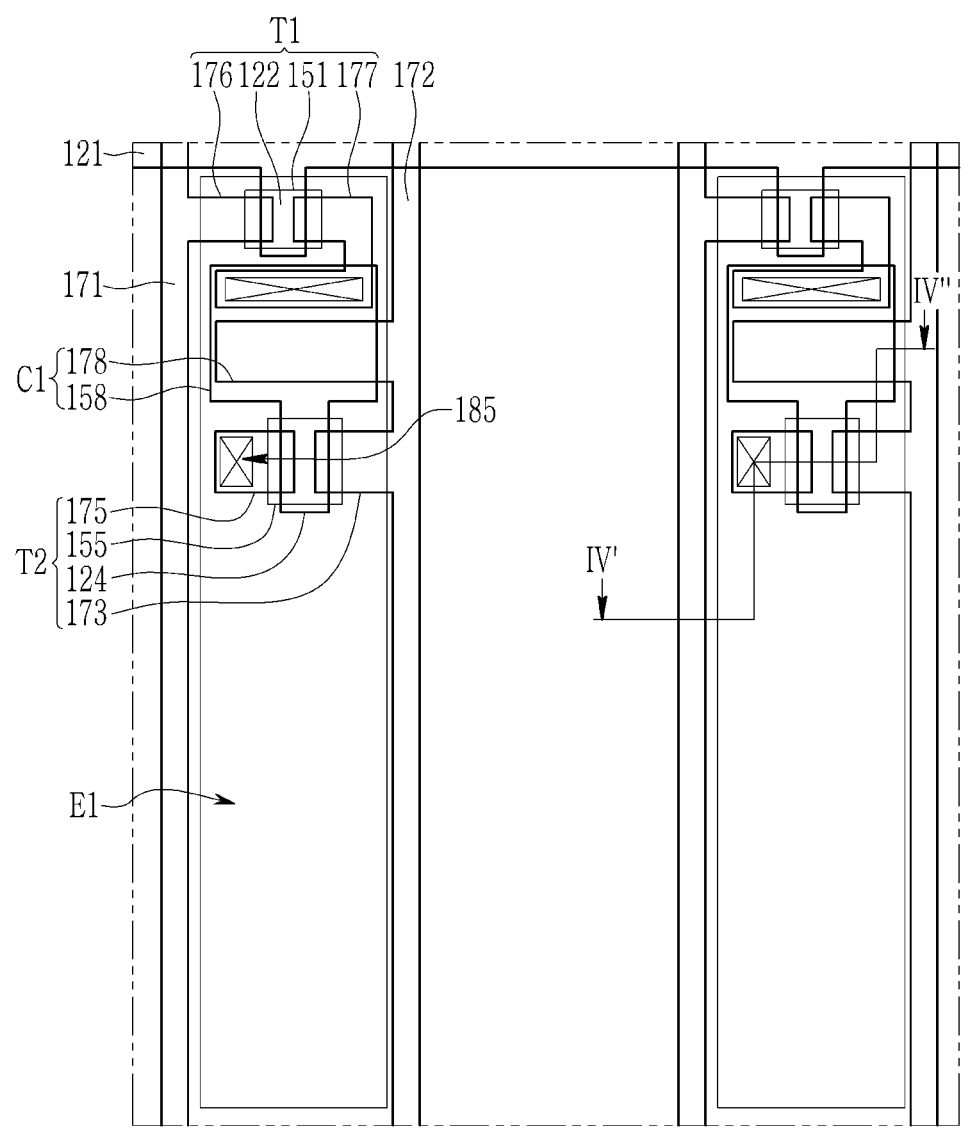
FIG. 4 is an enlarged top plan view illustrating portion A of FIG. 3.
Figure 5:
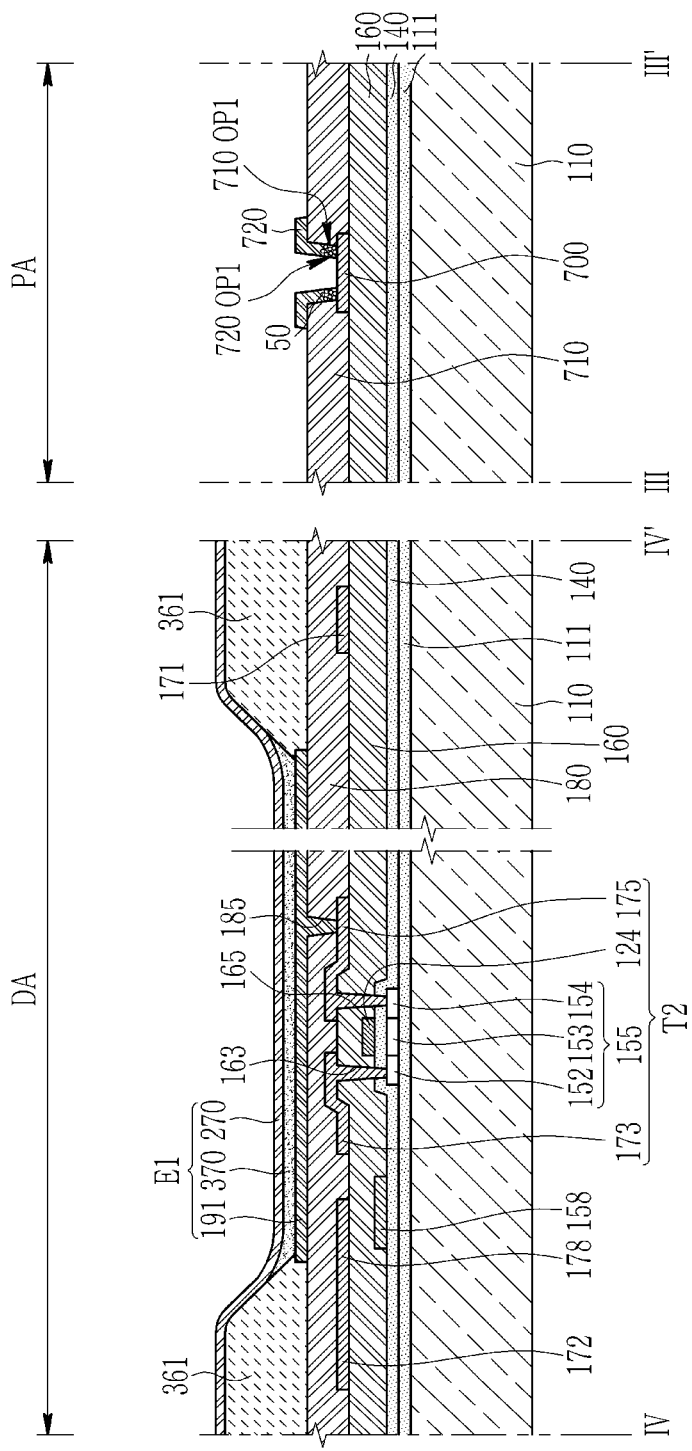
FIG. 5 illustrates a cross-sectional view of the portion A of the display device taken along line IV-IV' of FIG. 4 and a cross-sectional view of the pad region of the display device taken along line III-III' of FIG. 3.

Hereinafter, the pad region PA and the display area DA of the exemplary embodiment will be described in detail with reference to FIG. 4 and FIG. 5. FIG. 4 is an enlarged top plan view illustrating portion A of FIG. 3. FIG. 5 illustrates a cross-sectional view of the portion A of the display device taken along line IV-IV' of FIG. 4 and a cross-sectional view of a pad region taken along line III-Ill' of FIG. 3. The view of FIG. 5 omits the second substrate 200 for convenience of illustration.

In the drawing, an active matrix emissive display device having a 2Tr-1Cap structure in which two thin film transistors ("TFT") T1 and T2 and one capacitor C1 are included in each pixel among pixels of the display area DA is shown, but the invention and the exemplary embodiment are not limited thereto, As result, the emissive display device may include three or more transistors and two or more capacitors, and may have various structures by forming additional wires. In this case, the pixel is a minimum unit for displaying an image, and the display area displays the image with light through a plurality of pixels in the display area.

The display area DA will be described in detail with reference to FIG. 4 and FIG. 5. The first substrate 100 according to the exemplary embodiment includes a switching thin film transistor T1 formed in each of a plurality of pixels disposed in an insulation substrate 110, a driving thin film transistor T2, a capacitor C1 and a light-emitting device E1. The first substrate 100 further includes a gate line 121 disposed lengthwise extended in a first direction, and a data line 171 and a common power supply line 172 disposed lengthwise extended in a second direction to cross the gate line 121 while being insulating therefrom.

The display device and components thereof may be disposed in a plane parallel to a plane defined in the first and second directions. In FIG. 4, for example, the first direction may be horizontal while the second direction is vertical. A thickness of the display device and components thereof may be disposed in a third direction which crosses each of the first and second directions. In FIG. 5, for example, the third direction is vertical.

In one exemplary embodiment, each pixel may be defined according to boundaries between the gate line 121, the data line 171 and the common power supply line 172, but is not limited thereto.

The organic light emitting element E1 includes a pixel electrode 191, an emission layer 370 disposed on the pixel electrode 191, and a common electrode 270 disposed on the emission layer 370.

Herein, the pixel electrode 191 is an anode as a hole injection electrode, and the common electrode 270 is a cathode as an electron injection electrode. However, the invention is not limited thereto. In an exemplary embodiment, for example, the pixel electrode 191 may be the cathode and the common electrode 270 may be an anode according to a driving method of the emissive display device.

The light emitting layer 370 may include an organic light emitting layer, and light is generated and emitted when an exciton generated by combination of injected holes and electrons falls from an excited state to a ground state. Alternatively, the emission layer 370 may include quantum dots.

A capacitor C1 includes a pair of capacitor plates 158 and 178 disposed with an interlayer insulating layer 160 therebetween. Herein, the interlayer insulating layer 160 serves as a dielectric material. Capacitance is determined by a charge accumulated in the capacitor C1 and a voltage between the pair of capacitor plates 158 and 178.

The switching thin film transistor T1 includes a switching semiconductor layer 151, a switching gate electrode 122, a switching source electrode 176 and a switching drain electrode 177. The driving thin film transistor T2 includes a driving semiconductor layer 155, a driving gate electrode 124, a driving source electrode 173 and a driving drain electrode 175.

The switching thin film transistor T1 is used as a switching element for selecting a pixel to emit light. The switching gate electrode 122 is connected with the gate line 121, and the switching source electrode 176 is connected with the data line 171. The switching drain electrode 177 is disposed to be spaced from the switching source electrode 176, and is connected to one capacitor plate 158.

The driving thin film transistor T2 applies driving power for allowing the emission layer 370 of the organic light emitting element E1 in a selected pixel to generate and emit light, to the pixel electrode 191. The driving gate electrode 124 is connected with the capacitor plate 158 connected to the switching drain electrode 177. The driving source electrode 173 and the capacitor plate 178 are connected with the common power supply line 172.

The driving drain electrode 175 is connected with the pixel electrode 191 at a contact hole 185.

The display area DA and the pad region PA according to the exemplary embodiment will now be described with reference to FIG. 5 together with FIG. 4. A buffer layer 111 is disposed on the insulating substrate 110. The insulating substrate 110 may include or be made of glass, quartz, ceramic, plastic or the like. The buffer layer 111 may include or be made of a silicon nitride (SiNx), a silicon oxide ($SiO_x$), a silicon oxynitride (SiOxNy) or the like, but the invention is not limited thereto.

In the display area DA, the driving semiconductor layer 155 is disposed on the buffer layer 111. The driving semiconductor layer 155 may include or be formed of various semiconductor materials such as a polycrystalline silicon film and an amorphous silicon film. The driving semiconductor layer 155 may include or define a source region 152, a channel region 153 and a drain region 154.

A gate insulating film 140 including or made of a silicon nitride or a silicon oxide is disposed on the driving semiconductor layer 155. The driving gate electrode 124 and the first capacitor electrode plate 158 are disposed on the gate insulating film 140. In this case, the driving gate electrode 124 is disposed to overlap at least a portion of the driving semiconductor layer 155, specifically, the channel region 153.

The interlayer insulating layer 160 which covers the driving gate electrode 124 is disposed on the gate insulating layer 140. The interlayer insulating layer 160 may include or be formed of a silicon nitride, a silicon oxide or the like, similar to the gate insulating layer 140. The gate insulating film 140 and the interlayer insulating layer 160 have a first contact hole 163 and a second contact hole 165 defined therein that expose the source region 152 and the drain region 154 of the driving semiconductor layer 155, respectively.

In the display area DA, the driving source electrode 173, the driving drain electrode 175, the data line 171, the common power supply line 172 and the second capacitor plate 178 are disposed on the interlayer insulating layer 160, such as in a same layer among layers disposed on the insulation substrate 110. The driving source electrode 173, the driving drain electrode 175, the data line 171, the common power supply line 172 and the second capacitor plate 178 may be formed from a same material layer in a method of manufacturing a display device. The driving source electrode 173 and the driving drain electrode 175 are respectively connected to the source region 152 and the drain region 154 of the driving semiconductor layer 155 through the first contact hole 163 and the second contact hole 165.

In the pad region PA, a plurality of pads 700 are disposed on the interlayer insulating layer 160. In this case, the pads 700 may be formed by a same process and/or from a same material layer as the driving source electrode 173, the driving drain electrode 175 of the display area DA, and the like, such as to be formed of a same material as that thereof. In an exemplary embodiment, for example, the pads 700 may include aluminum. In addition, the pads 700 may have a triple-layer structure of titanium/aluminum/titanium, such that the aluminum layer is in a same layer as that of the driving source electrode 173, the driving drain electrode 175, etc. of the display area DA.

A planarization layer 180 which covers the driving source electrode 173 and the driving drain electrode 175 is disposed on the interlayer insulating layer 160. The planarization layer 180 may be formed in or extended into the pad region PA to serve as the first insulating layer 710 on the pad 700. As a result, the first insulating layer 710 of the pad region PA and the planarization layer 180 of the display area DA may be formed by using a same process and/or a same material layer so as to include a same material as each other. In an exemplary embodiment, for example, the planarization layer 180 and the first insulating layer 710 may include an organic material such as a polyacryl-based material or a polyimide-based material.

The first insulating layer 710 of the pad region PA may have a first opening 710 OP1 defined therein that overlaps the pad 700.

In the display area DA, the planarization layer 180 has a contact hole 185 defined therein. The pixel electrode 191 is disposed on the planarization layer 180. The pixel electrode 191 is connected with the driving drain electrode 175 at a contact hole 185. A partition wall 361 may be positioned on the planarization layer 180. The emission layer 370 is disposed to overlap the pixel electrode 191, and the common electrode 270 is disposed to overlap the emission layer 370. The light-emitting device E1 includes the pixel electrode 191, the emission layer 370 and the common electrode 270.

In the pad region PA, the second insulating layer 720 is disposed in the first opening 710 OP1 of the first insulating layer 710. The second insulating layer 720 has a second opening 720 OP1 defined therein. A width of the second opening 720 OP1 taken in a direction parallel to the upper surface of the insulation substrate 100 is smaller than that of the first opening 710 OP1. In an exemplary embodiment, for example, a width of an opening of the second insulating layer 720 may be in a range of about 5 μm to about 15 μm.

The silver particles 50 are positioned between the first insulating layer 710 and the second insulating layer 720, at an interface between the first insulating layer 710 and the pad 700. The silver particles 50 are surrounded and fixed by the second insulating layer 720.

The second insulating layer 720 may be an organic layer or an inorganic layer, and a thickness of the second insulating layer 720 may be in range of about 1 μm to about 3 μm. Since descriptions related to the pads 700, the first insulating layer 710 and the second insulating layer 720 are the same as those described with reference to FIG. 1, a duplicated description of the same constituent elements will be omitted.

As described above, the display device according to the exemplary embodiment further includes a second insulating layer 720 at an upper portion of the pad 700 of the pad region PA, such as at an interface of the pad 700 with the first insulating layer 710. The second insulating layer 720 may surround and fix the silver particles 50 which have precipitated at the upper portion of the pad 700 in the process of etching the pixel electrodes 191 of the display area DA, thereby preventing occurrence of pixel defects that occur due to movement of the silver particles 50 to the display area DA from the pad area PA. Therefore, minimizing pixel defects in the display device is possible.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate including a display area at which an image is displayed with light and a pad region at which the image is not displayed;
   a plurality of pads through which a signal is applied to the display area, the pads disposed in the pad region;
   a first insulating layer disposed between adjacent pads among the plurality of pads, in which a first opening is defined which exposes a respective pad among the adjacent pads;
   a second insulating layer disposed in the first opening of the first insulating layer, in which a second opening is defined which exposes the respective pad exposed by the first opening of the first insulating layer; and
   silver particles disposed in the first opening, between the first insulating layer and the second insulating layer.

2. The display device of claim 1, wherein the silver particles disposed in the first opening are positioned at an interface between the respective pad and the first insulating layer and are covered with the second insulating layer.

3. The display device of claim 1, wherein the pads include a material having a degree of ionization lower than that of silver.

4. The display device of claim 1, wherein the second insulating layer includes an organic layer or an inorganic layer.

5. The display device of claim 4, wherein the second insulating layer includes polyimide.

6. The display device of claim 1, wherein
the display area includes:
- a thin film transistor including a gate line, a data line and a semiconductor; and
- a first electrode connected with the thin film transistor, and the pads in the pad area include a same material as that of the data line in the display area.

7. The display device of claim 6, wherein the pads include aluminum.

8. The display device of claim 7, wherein the pads have a triple-layer structure of titanium/aluminum/titanium.

9. The display device of claim 6, wherein the first electrode includes silver.

10. The display device of claim 9, wherein the first electrode has a triple-layer structure of indium tin oxide/silver/indium tin oxide.

11. The display device of claim 6, wherein
the display area further includes an interlayer insulating layer disposed between the thin film transistor and the first electrode, and
the interlayer insulating layer in the display area includes a same material as that of the first insulating layer between the adjacent pads in the pad region.

12. The display device of claim 1, wherein a dimension of the silver particles in the first opening of the first insulating layer is in a range of about 0.1 micrometer to about 1 micrometer.

13. The display device of claim 1, wherein a thickness of the second insulating layer in the first opening of the first insulating layer is in a range of about 1 micrometer to about 3 micrometers.

14. The display device of claim 1, wherein the second insulating layer in the first opening of the first insulating layer contacts a side surface and a top surface of the first insulating layer at the first opening thereof.

15. The display device of claim 1, wherein a width of the second opening of the second insulating layer is in a range of about 5 micrometers to about 15 micrometers.

16. A display device comprising:
- a substrate including a display area at which an image is displayed with light and a pad region at which the image is not displayed;
- a pad through which a signal is applied to the display area, the pad disposed in the pad region;
- a first insulating layer disposed on the pad, in which a first opening is defined which exposes the pad;
- a second insulating layer disposed in the first opening of the first insulating layer, in which a second opening is defined which exposes the pad exposed by the first opening of the first insulating layer; and
- silver particles disposed in the first opening, at an interface between the first insulating layer and the pad, the silver particles covered by the second insulating layer.

* * * * *